United States Patent
Wahler et al.

(10) Patent No.: US 6,874,327 B1
(45) Date of Patent: Apr. 5, 2005

(54) FAN CONTROL SYSTEM WITH IMPROVED TEMPERATURE RESOLUTION

(75) Inventors: Richard E. Wahler, St. James, NY (US); Eileen M. Marando, Bellmore, NY (US); Steven Burstein, Smithtown, NY (US); Wayne A. Miller, Port Jefferson Station, NY (US)

(73) Assignee: Standard Microsystems Corporation, Hauppauge, NY (US)

( * ) Notice: Subject to any disclaimer, the term of this patent is extended or adjusted under 35 U.S.C. 154(b) by 0 days.

(21) Appl. No.: 10/724,927

(22) Filed: Dec. 1, 2003

(51) Int. Cl.[7] ............ F25D 17/00; H02P 1/00; G05B 5/00
(52) U.S. Cl. ............ 62/178; 318/268; 318/471; 327/175
(58) Field of Search ............ 62/178; 375/238; 318/807, 599, 268, 471, 472; 327/175

(56) References Cited

U.S. PATENT DOCUMENTS

| | | |
|---|---|---|
| 4,722,669 A | 2/1988 | Kundert |
| 4,727,468 A | 2/1988 | Maekawa |
| 5,249,741 A | 10/1993 | Bistline et al. |
| 5,307,439 A | 4/1994 | Enami |
| 5,687,079 A | 11/1997 | Bauer et al. |
| 5,727,928 A | 3/1998 | Brown |
| 5,825,972 A | 10/1998 | Brown |
| 5,942,866 A | 8/1999 | Hsieh |
| 5,962,933 A | 10/1999 | Henderson et al. |
| 5,990,582 A | 11/1999 | Henderson et al. |
| 6,182,902 B1 | 2/2001 | Shih |
| 6,188,189 B1 | 2/2001 | Blake |
| 6,208,538 B1 | 3/2001 | Halamik et al. |
| 6,226,324 B1 | 5/2001 | Allstrom |
| 6,247,898 B1 | 6/2001 | Henderson et al. |
| 6,262,549 B1 | 7/2001 | Yang et al. |
| 6,519,167 B1 | 2/2003 | Nguyen |
| 6,528,987 B1 | 3/2003 | Blake et al. |
| 6,563,284 B2 | 5/2003 | Teutsch et al. |
| 6,601,168 B1 | 7/2003 | Stancil et al. |
| 6,650,074 B1 | 11/2003 | Vyssotski et al. |
| 6,661,679 B1 | 12/2003 | Yang et al. |
| 2003/0193307 A1 | 10/2003 | Burstein |
| 2004/0001542 A1 | 1/2004 | Miller, Jr. |

OTHER PUBLICATIONS

Marando et al., U.S. Appl. No. 10/459,169 entitled "Programmable PWM Stretching for Tachometer Measurement", filed on Jun. 11, 2003.

Analog Devices, Publication ADM1027, "dBCOOL™ Remote Thermal Controller and Voltage Monitor," 2003, 56 pages.

National Semiconductor Corporation, Publication LM63, "±1°C Accurate Remote Diode Digital Temperature Sensor with Integrated Fan Control," Feb. 2003, 28 pages.

Stephen Ohr, "Analog IC vendors find 'Intel Inside' a safe bet," Sep. 12, 2002, online at http://www.eetimes.com/story/OEG20020912S0026.

*Primary Examiner*—Chen Wen Jiang
(74) *Attorney, Agent, or Firm*—Meyertons Hood Kivlin Kowert & Goetzel, P.C.; Jeffrey C. Hood

(57) ABSTRACT

A system and method for increasing resolution of pulse width modulated (PWM) signal duty cycle calculations in a fan speed control system operating to control rotational speed of at least one fan. The method may comprise obtaining a temperature reading from a first temperature sensor in the fan speed control system during a first time period. The temperature reading has resolution of a first number of bits. A portion of the first number of bits is selected for calculating a PWM signal duty cycle with the resolution of the first number of bits in the temperature reading using only the portion of the first number of bits and zone parameters associated with the first temperature sensor. The PWM signal duty cycle may then be converted into a PWM signal that may be provided to the at least one fan.

21 Claims, 6 Drawing Sheets

Table 1- Range Selection represented as Mantissa and Divider

| Range Selection Bits | Range °C | (1/Range °C)/256 | Binary Representation (1/Range °C)/256 | Mantissa | Divider used for Shift |
|---|---|---|---|---|---|
| 0000 | 2 | 128/256 | .10000000 | 10000000 | 0 |
| 0001 | 2.5 | 102.4/256 | .01100110 | 01100110 | 0 |
| 0010 | 3.33 | 76.8/256 | .01001101 | 01001101 | 0 |
| 0011 | 4 | 64/256 | .01000000 | 10000000 | 1 |
| 0100 | 5 | 51.2/256 | .00110011 | 01100110 | 1 |
| 0101 | 6.67 | 38.4/256 | .00100110 | 01001101 | 1 |
| 0110 | 8 | 32/256 | .00100000 | 10000000 | 2 |
| 0111 | 10 | 25.6/256 | .00011001 | 01100110 | 2 |
| 1000 | 13.33 | 19.2/256 | .00010011 | 01001101 | 2 |
| 1001 | 16 | 16/256 | .00010000 | 10000000 | 3 |
| 1010 | 20 | 12.8/256 | .00001100 | 01100110 | 3 |
| 1011 | 26.67 | 9.6/256 | .00001001 | 01001101 | 3 |
| 1100 | 32 | 8/256 | .00001000 | 10000000 | 4 |
| 1101 | 40 | 6.4/256 | .00000110 | 01100110 | 4 |
| 1110 | 53.33 | 4.8/256 | .00000100 | 01001101 | 4 |
| 1111 | 80 | 3.2/256 | .00000011 | 01100110 | 5 |

FIG. 6A

Table 1: Computing LSbits for DeltaTemp[1:0] = CurrentTemp

| Current Temp | Zone Limit | DeltaTemp[1:0] |
|---|---|---|
| POS.xx | POS.00 | xx |
| POS.xx | NEG.00 | xx |
| NEG.00 | NEG.00 | 00 |
| NEG.01 | NEG.00 | 11 |
| NEG.10 | NEG.00 | 10 |
| NEG.11 | NEG.00 | 01 |
| NEG.xx | POS.00 | Can't Happen |

Note: POS = Positive number; NEG = Negative number; .xx => Current Temp [1:0] = don't care; the decimal point followed by 2 numbers represents the 2 LSbits of the value. They are binary numbers.

Note: The autofan algorithm only computes DeltaTemp when the Current Temp is greater than or equal to the Zone Limit.

Note: All cases, except those in the shaded rows, the two LSbits of the Current Temp become the two LSbits of DeltaTemp.

FAN CONTROL SYSTEM WITH IMPROVED TEMPERATURE RESOLUTION

BACKGROUND OF THE INVENTION

1. Field of the Invention

This invention relates to cooling equipment for electronic systems, e.g., fans, and more particularly, to controlling the rotational speed of a fan.

2. Description of the Related Art

Fans are often used to evacuate warm air from enclosures in which electronic systems are contained. For example, most computer systems include one or more cooling fans to aid in circulating the air inside the enclosures and for maintaining the temperature inside the enclosures within an acceptable range. The increased airflow provided by fans typically aids in eliminating waste heat that may otherwise build up and adversely affect system operation. Employing cooling fans is especially helpful in ensuring proper operation for certain central processing units (CPUs) with relatively high operating temperatures.

Control of fans in a system typically involves a fan control unit executing a fan control algorithm. A fan control algorithm may determine the method for controlling one or more fans that are configured to evacuate warm air from a system enclosure. For example, the fan control algorithm may specify that a fan's speed should be increased or decreased dependent upon a detected temperature. Such control algorithms may also involve turning off a fan if the temperature is deemed cool enough to do so.

For detecting the temperature, a temperature sensor may provide to the fan control unit a signal indicative of the current temperature of a particular temperature zone in the electronic system. The temperature sensor typically provides an 8-bit resolution value that corresponds to the temperature that is detected. This 8-bit temperature value is then used by the fan control unit to adjust the fan speed in the electronic system.

Often, fans used for CPU and/or computer system cooling have a three-wire interface with wires for power, ground, and a tachometer signal. Fan drive systems often use a signal generator that provides a Pulse Width Modulated (PWM) signal to drive an external circuit that controls the voltage between the power and ground interfaces of the fan, which in turn controls the speed of the fan. Signal generators that provide PWM signals are useful because they provide a digital control for the pulse width of a signal. The fan is typically powered only for the duration of the pulse. Between pulses power to the fan is turned off, although the fan is typically still spinning during this time. The duty cycle of the PWM pulse train currently being provided to the fan determines the fan's speed.

One problem associated with using signal generators that provide PWM signals to drive fan circuits is that the 8-bit resolution from the temperature sensors for creating the PWM signals limits fine adjustments to the PWM signal when the temperature changes by a very small amount. The lack of fine adjustment to the PWM signal causes the fan to make undesirably large fan speed adjustments when only a small adjustment would suffice, thereby causing bursts of fan speed that produce loud and annoying noises when the PWM signal is adjusted. Another problem associated with using signal generators that provide PWM signals to drive fan circuits is that multiple cooling zones create the need for multiple sensors and multiple fans, thereby causing the need for complex management schemes in fan operation management.

Many other problems and disadvantages of the prior art will become apparent to one skilled in the art after comparing such prior art with the present invention as described herein.

SUMMARY OF THE INVENTION

In one set of embodiments, the invention comprises a system and method for increasing resolution of pulse width modulated (PWM) signal duty cycle calculations in a fan speed control system operating to control rotational speed of at least one fan. In one embodiment, a fan control system may comprise at least one temperature sensor operable to obtain a temperature reading having a resolution of a first number of bits. Each temperature sensor may have related sensor parameters. The fan control system may also include a PWM signal generator operable to generate a PWM signal duty cycle according to a portion of the first number of bits. The sensor parameters allow the PWM signal duty cycle to be generated with a temperature resolution of the first number of bits using only the portion of the first number of bits. The PWM signal duty cycle may then be used to generate a PWM control signal that is provided to control the speed of the fan.

The method may comprise obtaining a temperature reading from a first temperature sensor in the fan speed control system during a first time period. The temperature reading has a resolution of a first number of bits, e.g., 10 bits. A portion of the first number of bits, e.g., 8 bits, is selected for calculating a PWM signal duty cycle. Despite the fact that only a portion of the first number of bits, e.g., 8 of the 10 bits, is selected for calculating the duty cycle, the duty cycle is calculated with the resolution available if all of the first number of bits in the temperature reading were used, e.g., with 10 bit resolution. This is possible by circuitry that selectively utilizes portions of the first number of bits in combination with a reduced active temperature range for the bits. In other words, in one embodiment, only 8 bits of the temperature reading are used, while a 10-bit resolution is maintained, this being achieved at the expense of a smaller temperature range that is analyzed. This allows current 8-bit fan hardware to be used, while still achieving 10-bit resolution provided by the 10-bit temperature reading.

The method may thus comprise computing a desired PWM signal duty cycle according to the first number of bits and the zone parameters associated with the first temperature sensor. The zone parameters may include a zone limit, a zone range, a PWM minimum, a PWM maximum, a resolution parameter (N value), and a current temperature. The desired PWM signal duty cycle may be compared to a predetermined minimum and/or maximum PWM duty cycle to determine if the PWM signal duty cycle should be calculated. The PWM signal duty cycle may then be converted into a PWM signal that may be provided to control the duty cycle of the fan.

In various embodiments, selecting the portion of the first number of bits may comprise selecting eight bits, wherein the eight bits may offer one degree temperature resolution, one half degree temperature resolution, or one fourth degree temperature resolution. The different bit selection options may be determined through a program, wherein the eight bits may be selected according to the zone parameters of the fan speed control system. As noted above, the 8-bit configuration is attractive because it allows existing 8-bit fan control hardware (also called 'autofan hardware') to be incorporated into the system, thereby avoiding unnecessary duplication of previously designed hardware.

In one embodiment, the first number of bits of the fan control system may comprise ten bits and the sensor parameters are configured to allow 10-bit resolution of the temperature sensor readings with the portion of the first number of bits. Similar to the above method, the portion of the first number of bits may comprise eight bits of temperature information, wherein the PWM signal generator is operable to calculate PWM signals at ¼, ½, and 1 degree resolution from eight bits of temperature information.

Thus, various embodiments of the systems and methods described above may facilitate design of a system to accurately control the speed of a fan in an electrical system, while minimizing audio noise and maintaining smooth fan operation. Various embodiments may enable the use of existing 8-bit fan hardware in combination with 10-bit temperature resolution.

BRIEF DESCRIPTION OF THE DRAWINGS

The foregoing, as well as other objects, features, and advantages of this invention may be more completely understood by reference to the following detailed description when read together with the accompanying drawings in which:

FIG. 6A is a table that shows values that may be used in formulas that are used to calculate duty cycles according to principles of the present invention.

FIG. 6B is a table that shows values that may be used to calculate duty cycle according to principles of the present invention when the temperature range to be monitored covers both positive and negative temperatures.

Figure 1:
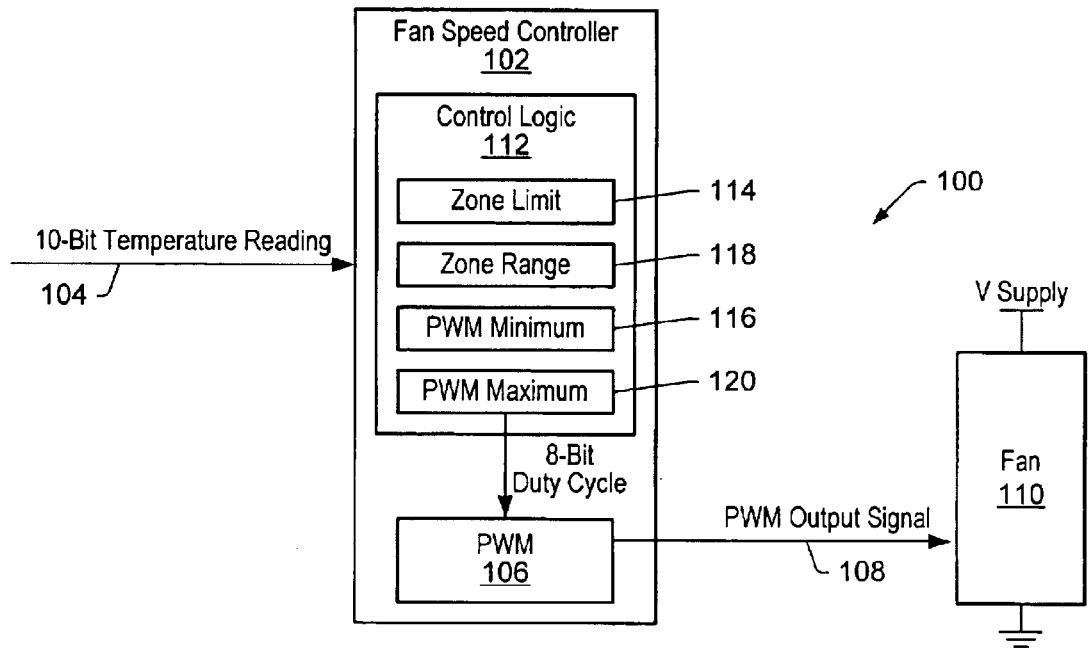
FIG. 1 illustrates one embodiment of a system to control the speed of a fan, implemented in accordance with the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not to be used to limit or interpret the description or claims. Furthermore, note that the word "may" is used throughout this application in a permissive sense (i.e., having the potential to, being able to), not a mandatory sense (i.e., must)." The term "include" and derivations thereof mean "including, but not limited to". The term "coupled" means "directly or indirectly connected".

DETAILED DESCRIPTION OF THE PREFERRED EMBODIMENTS

Fan speed control systems often control a fan with a PWM (pulse width modulated) signal generated by a PWM signal generator. The signal generator receives PWM signal parameters for calculation of the PWM signal at a particular time. One of the PWM signal parameters is "duty cycle." The duty cycle of a PWM signal is the ratio of the amount of time that the PWM signal is asserted to being non-asserted. For example, a PWM signal having a 50% duty cycle is understood to be a PWM signal asserted half the time. The greater the PWM duty cycle, the faster the fan operates, and thus, the greater the air movement is in the fan speed control system. For example, a 100% duty cycle produces a PWM signal that powers the fan at a maximum, whereas a 0% duty cycle produces a PWM signal that turns the fan off.

The duty cycle is calculated, in part, from a temperature difference value referred to herein as the "DeltaTemp." The DeltaTemp value is calculated in various manners depending on the fan speed control system. As described in more detail herein, in one embodiment, the DeltaTemp value is the difference between the current temperature indicated by a temperature sensor and a predefined zone limit temperature value when the current temperature is greater than or equal to the predefined zone limit temperature. The DeltaTemp value may then be used to calculate the duty cycle of a desired PWM signal and the PWM signal generator may generate a PWM signal having a corresponding duty cycle for controlling the speed of the fan.

FIG. 1 illustrates one embodiment of a fan speed control system 100 to control the speed of a fan. A fan speed controller 102 is configured to receive a temperature reading 104 from a temperature sensor with a first number of bits, e.g., a 10-bit resolution temperature sensor. Temperature readings in the fan speed control system 100 range from −127 degrees Celsius to +127 degrees Celsius. The fan speed controller 102 includes a PWM signal generator 106 that generates a PWM output signal 108 that is provided to a fan 110 to control the rotational speed of the fan 110. While temperature of the fan speed control system 100 is in an active range of the −127° C.−+127° C. readings, the PWM signal generator 106 produces a PWM signal with 10-bit resolution while utilizing only 8 of the 10 bits from the temperature reading 104. This is made possible by bit manipulations made in the 10-bit control logic 112 prior to sending the 8-bits to the PWM signal generator 106. More specifically, 8 bits of the temperature reading may be used to provide 10 bit resolution by reducing the active temperature range to a smaller range. This configuration is advantageous for at least the reason that the fan 110 may be controlled at a higher resolution while using existing 8-bit PWM hardware such as the PWM signal generator 106. This allows re-use of the existing 8-bit fan control logic (autofan logic) while supporting 10-bits of temperature resolution, if desired.

In one embodiment, the fan control logic utilizes a variable n to selectively support the 10-bit resolution, where n is a value from 0 to 2. The variable n is used to define the unit resolution of the temperature used to calculate the PWM duty cycle and the maximum temperature range supported. In most embodiments, a maximum theoretical temperature range may be limited only by corresponding maximum programmable temperature range options. The following examples illustrate the use of n:

n=0:
  PWM duty cycle is computed from temperature readings with a 1-degree unit resolution.
    Maximum Temperature Range that can be supported is 255 degrees
    Maximum Programmable Temperature Range is 80 degrees.

n=1:
  PWM duty cycle is computed from temperature readings with a ½-degree unit resolution.
    Maximum Temperature Range that can be supported is 128.5 degrees
    Maximum Programmable Temperature Range is 80 degrees.

n=2:
  PWM duty cycle is computed from temperature readings with a ¼-degree unit resolution.
    Maximum Temperature Range that can be supported is 64.75 degrees
  Maximum Programmable Temperature Range is 53.33 degrees.

The maximum programmable temperature range options, as shown in the above examples, may have been previously determined based on a variety of factors.

The following formulas illustrate calculations that may be used to obtain 10-bit resolution using only eight of the ten bits in accordance with one embodiment of the present invention.

Note: The following equations may only be applicable if the condition to support only Positive Temperature Limits (Zone Limit≧0) is imposed on the user.

Current Duty Cycle = Minimum PWM + Delta PWM
Delta PWM = DeltaTemp_sel * (MaxPWM-MinPWM) * (1/Range)
      if (n=0) DeltaTemp_sel = DeltaTemp[9:2]
      if (n=1) DeltaTemp_sel = DeltaTemp[8:1]
      if (n=2) DeltaTemp_sel = DeltaTemp[7:0]
    DeltaTemp[9:2] = Current Temp[9:2] - Zone Limit[7:0]
    DeltaTemp[1:0] = Current Temp[1:0] If Shifted Zone Limit ≥ 0
      1/Range = (256/Range)/256 = (256/Range)>>8
      256/Range = Mantissa >> Divider
Delta PWM = ( (DeltaTemp_Sel *( ((MaxPWM-MinPWM) *Mantissa)>>8 ) >>Divider ) >> n Note: The Mantissa and divider are defined in Table 1, found in FIG. 6A.

The autofan algorithm preferably only computes DeltaTemp when the Current Temp is greater than or equal to the Zone Limit, and in all cases described with the values of Table 1, except those cases in the shaded rows, the two least significant bits (LSBs) of the Current Temp become the two LSBs of DeltaTemp.

In software associated with the fan control system 100, an N value is set that influences which of the 8 bits from the 10-bit temperature reading 104 are to be used with the control logic to calculate the PWM output signal 108. The bit selection determines the resolution that is used in the PWM output signal 108. For example, if N=0, then bits 2–9 of the 10 bit temperature reading 104 are mapped directly to bits 0–7 of the 8-bit input of the PWM signal generator 106. This arrangement essentially ignores the two least significant bits of the 10-bit temperature reading 104 and operates the fan control system 100 at 1-degree temperature resolution. If N=1, then bits 1–8 of the 10 bit temperature reading 104 are mapped to bits 0–7 of the 8-bit input of the PWM signal generator 106. This arrangement ignores the least significant bit of the 10-bit temperature reading 104 and operates the fan control system 100 at ½-degree temperature resolution. Finally, if N=2, then bits 0–7 of the 10 bit temperature reading 104 are mapped to bits zero through seven of the 8-bit input of the PWM signal generator 106. This arrangement operates the fan control system 100 at ¼-degree temperature resolution. These mappings are shown in greater detail in FIGS. 2A–2C, according to one embodiment of the present invention.

Figure 2A:
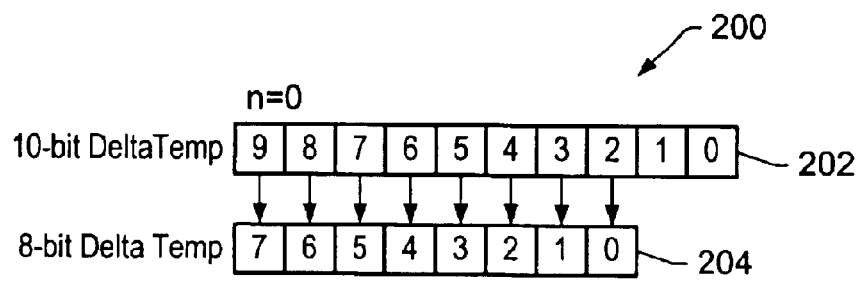
FIG. 2A illustrates a mapping of the bits of a 10-bit temperature difference reading to an 8-bit difference value, according to one embodiment of the present invention.

FIG. 2A illustrates a mapping 200 of the bits of a 10-bit temperature difference reading 202 to an 8-bit difference value 204 (DeltaTemp). The 8-bit difference value 204 is used in the control logic 112 to calculate the duty cycle for the PWM output signal 108. As illustrated, the temperature difference reading 202 is a 10-bit value that reflects a difference in the actual 10-bit temperature reading and, for example, the zone limit 114. The 8-bit difference value 204 is generated by mapping bits 2–9 of the 10-bit difference value 202 to bits 0–7 of the 8-bit difference value 204. As indicated, this particular mapping 200 occurs when N=0 and provides 1 degree temperature resolution duty cycle calculations.

Figure 2B:
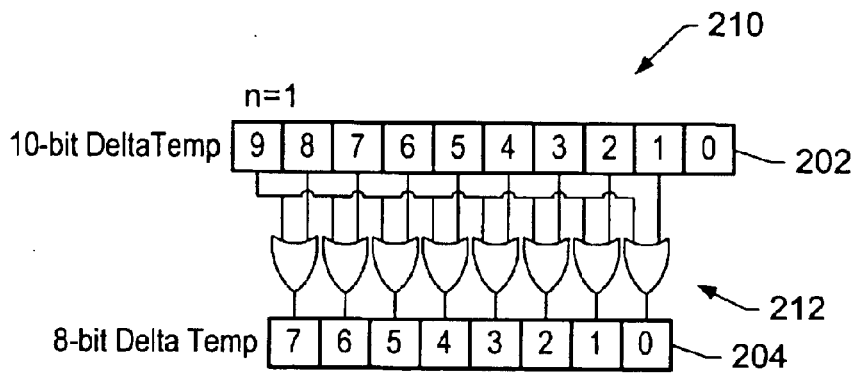
FIG. 2B illustrates a second mapping of the bits of a 10-bit temperature difference reading to an 8-bit difference value, according to one embodiment of the present invention.

FIG. 2B illustrates a second mapping 210 of the bits of the 10-bit temperature difference reading 202 to the 8-bit difference value 204. As illustrated, the 8-bit difference value 204 is generated by mapping bits 1–8 of the 10-bit difference value to bits 0–7 of the 8-bit difference value 204. As indicated, this particular mapping occurs when N=1 and provides ½ degree temperature resolution duty cycle calculations. Of note, OR gates 212 are configured to set all bits of the 8-bit temperature difference value 204 when the most significant bit (bit 9) of the 10-bit temperature difference reading 202 is set. The setting of all bits of the 8-bit difference value 204 forces a maximum value for the 8-bit difference value 204 to accommodate for the loss of the most significant bit when a ½ degree temperature resolution is selected.

The control logic 112 includes zone parameters such as a zone limit 114 that signifies the minimum temperature to recognize as part of the active range for the PWM output signal 108. If the temperature reading 104 is below the zone limit 114, the PWM signal generator 106 automatically produces the PWM output signal 108 with PWM minimum duty cycle 116. A zone range 118 is specified in the control logic 112 to define the maximum temperature to recognize as part of the active range for the PWM output signal 108. The zone range 118 may vary from 2–80 degrees Celsius. If the temperature reading 104 is above the zone limit 114 plus the zone range 118, the PWM signal generator 106 automatically produces the PWM output signal 108 with PWM maximum duty cycle 120 because the maximum temperature has been exceeded. Of note, when the temperature reading 104 exceeds an absolute maximum, the PWM output signal 108 is often set to a full-on duty cycle, not to be confused with the PWM maximum 120 value. Similarly, when temperature reading 104 falls below an absolute minimum, PWM output signal 108 may be set to a full-off duty cycle, or to PWM minimum 116, or to a full-off duty cycle qualified by a predetermined hysteresis zone value.

Figure 2C:
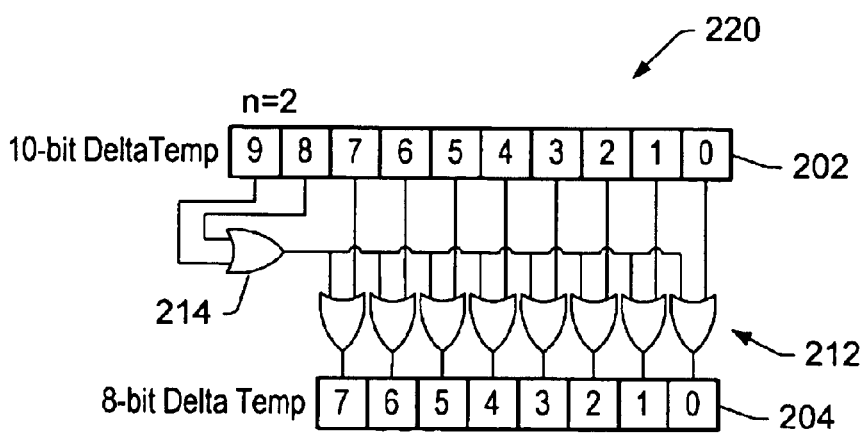
FIG. 2C illustrates yet another mapping of the bits of a 10-bit temperature difference reading to an 8-bit difference value, according to one embodiment of the present invention.

FIG. 2C illustrates yet another mapping 220 of the bits of the 10-bit temperature difference reading 202 to the 8-bit difference value 204, according to one embodiment of the present invention. As illustrated, the 8-bit difference value 204 is generated by mapping bits 0–7 of the 10-bit difference value to bits 0–7 of the 8-bit difference value 204. As indicated, this particular mapping occurs when N=2 and provides ¼ degree temperature resolution duty cycle calculations. Of note, OR gates 212 and 214 are configured to set all bits of the 8-bit temperature difference value 204 when one or both of the most significant bits (bits 9 and 8) of the 10-bit temperature difference reading 202 is/are set. The setting of all bits of the 8-bit difference value 204 forces a maximum value for the 8-bit difference value 204 to accommodate for the loss of the most significant bits when a ¼ degree temperature resolution is selected.

Figure 5:
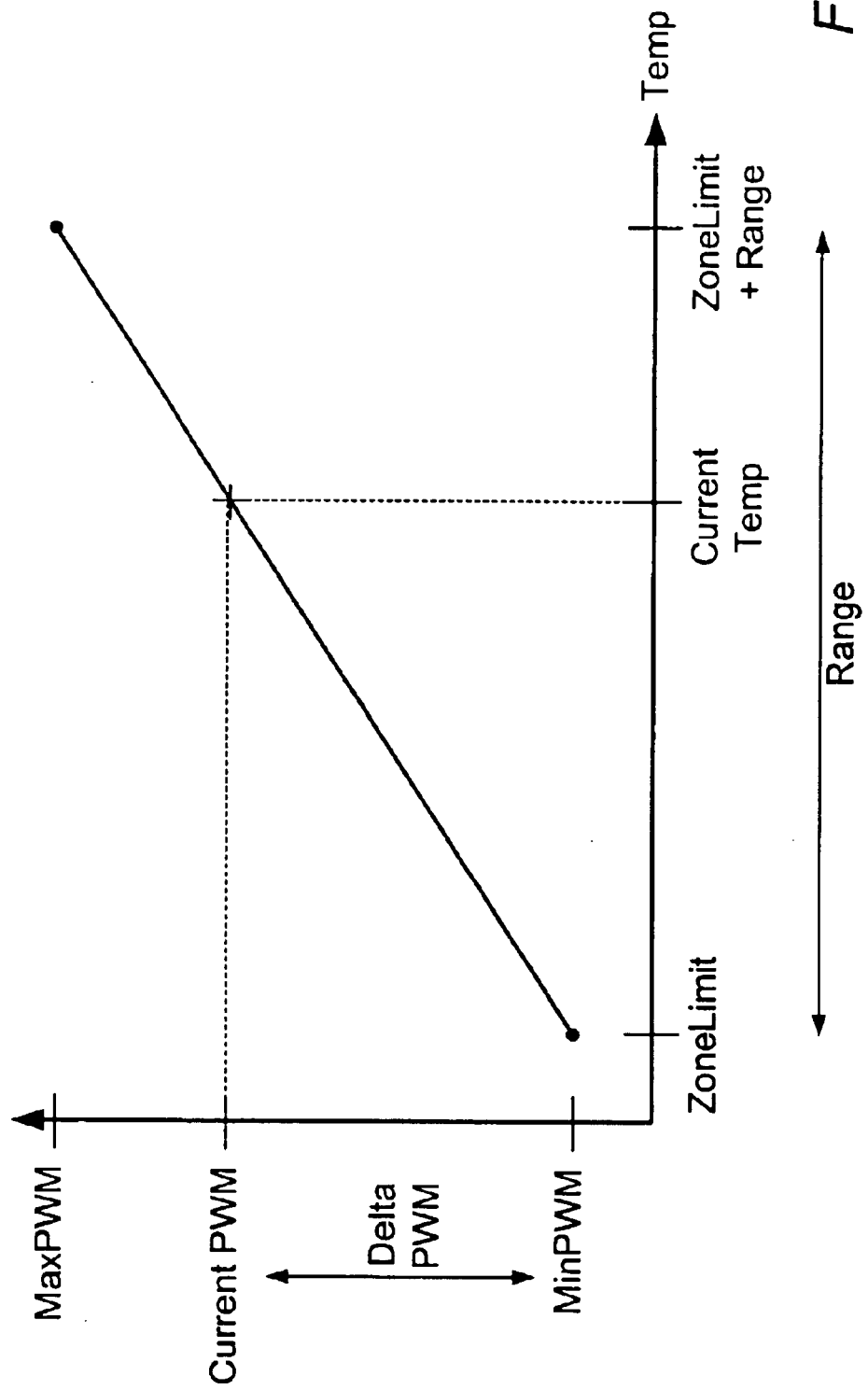
FIG. 5 illustrates a graphical representation of PWM signal duty cycle vs. temperature during the active temperature range for an exemplary autofan block signal that incorporates principles according to certain but not other aspects of the present invention.

FIG. 5 illustrates a graphical representation 500 of PWM signal duty cycle vs. temperature during the active temperature range for an exemplary autofan block signal that incorporates principles according to certain but not other aspects of the present invention. As illustrated, the value contained in the PWM minimum register 116 is represented by MinPWM on the PWM-axis of the graph 500. The value contained in the PWM maximum register 120 is represented by MaxPWM on the PWM-axis. The zone limit register 114 is represented by ZoneLimit on the Temp-axis and the value contained in the zone range register 118 is represented by ZoneLimit+Range on the Temp-axis.

The Current PWM value is calculated from adding the Delta PWM value to the MinPWM value. The Delta PWM value is calculated from the Current Temp value. As illustrated, line 502 of graph 500 represents the relationship between temperature and the current duty cycle. In one embodiment, any time the temperature in a particular zone is greater than or equal to the absolute limit of that zone, all fans that are not disabled will be forced to a full on, i.e., Current PWM would be set to FFh.

When the temperature exceeds the absolute limit, the fan being evaluated for that zone will be set to operate in a full-on mode. Similarly, when the temperature reaches or exceeds the ZoneLimit+Range value, the fan being evaluated for that zone will be set to the MaxPWM, with the setting for exceeding the absolute limit taking precedence. As these calculations are not the focus of the present disclosure, in an effort to reduce the logic needed to calculate the Current PWM, it is sufficient to say that an alternate method may be used to calculate MaxPWM.

When the temperature falls below the lower absolute limit, the fan being evaluated for that zone is set to operate in a full-off mode qualified by a predetermined hysteresis value. Similarly, when the temperature reaches or falls below the ZoneLimit, the fan being evaluated for that zone is set to the MinPWM, with the setting for dipping below the lower absolute limit taking precedence. Similar to MaxPWM settings, it is sufficient to say that an alternative method is used to calculate the MinPWM. When/if temperatures reach the lower absolute limit, all fans of that zone may be turned off, i.e., Current PWM may be set to zero.

Figure 3:
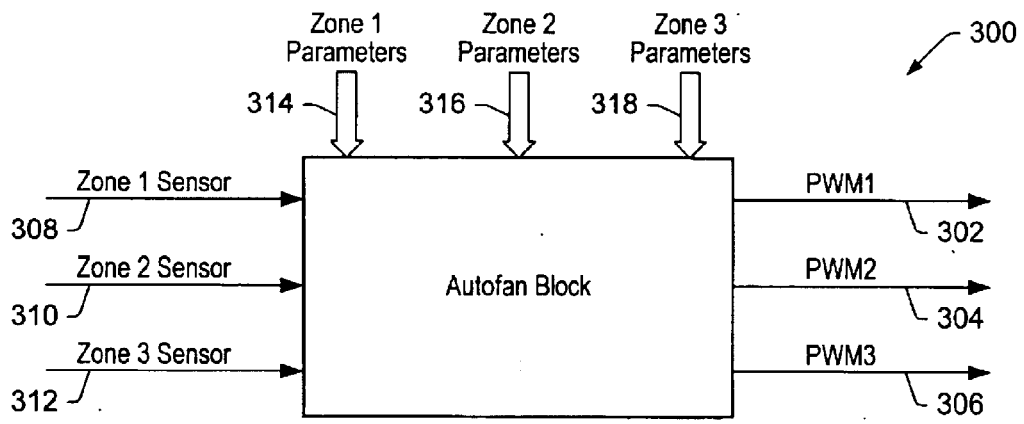
FIG. 3 illustrates an autofan block where temperature sensors from three temperature zones are monitored to create three different PWM signals according to one embodiment of the present invention.

FIG. 3 illustrates a fan control block 300, referred to as an autofan block, that may be used to generate three PWM signals 302, 304, and 306 based on input signals from three zones of a computer system in accordance with certain but not other principles of the present invention. The input signals typically include zone sensor inputs 308, 310, and 312, and their corresponding zone parameter inputs 314, 316, and 318. The autofan block 300 uses an autofan algorithm with the three zone sensor inputs 308, 310, and 312. The zone parameter inputs 314, 316, and 318 control which of the sensor inputs 308, 310, and 312 will control which of the PWM signal outputs 302, 304, and 306. The zone sensor inputs 308, 310, and 312 correspond with sensors that are located in the various zones of a computer system.

The temperature of each of the zones in the computer system is monitored and controlled by the sensors in conjunction with the corresponding zone parameter input. For example, the autofan block 300 may be configured such that each PWM signal 302, 304, and 306 is generated by a respective zone sensor input 308, 310, and 312 and its corresponding zone parameter input 314, 316, and 318. On the other hand, each PWM signal 302, 304, and 306 could be generated after analyzing two or more of the zone sensor inputs 308, 310, and 312 with its corresponding zone parameter input 314, 316, and 318. Specifically, the PWM signal 302 could be generated from the zone sensor input 310 after a determination that the PWM signal 302 is to be controlled by the "hottest" of zone sensor inputs 308 and 310 and zone sensor input 310 is found to be the hottest. Alternatively, the PWM signal 302 could be configured to be controlled by the hottest of zone sensor inputs 308, 310, and 312. If the PWM signal 302 is configured for one of the hottest options, the zone sensor that produces the highest duty cycle will control the PWM signal 302. As may be appreciated upon review of the present disclosure, other variations/combinations of the zone parameter inputs 314, 316, and 318, and the zone sensor inputs 308, 310, and 312 are possible to generate the PWM signals 302, 304, and 306.

The autofan block 300 includes at least one PWM signal generator that generates a PWM signal that powers a fan. The PWM signal generator may generate the PWM signal in response to one or more control signal(s) from a fan control unit. For example, the PWM signal generator may modify the duty cycle of the PWM signal, or cease generating the PWM signal altogether, in response to one or more control signals from the fan control unit.

Figure 4B:
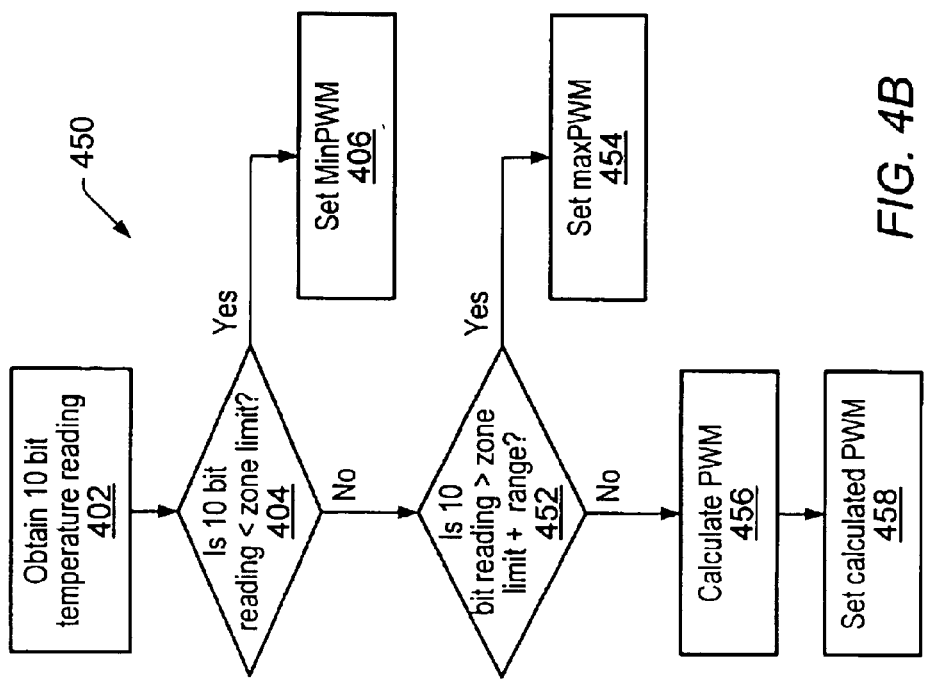
FIG. 4B is a flow diagram of another method for calculating PWM signals in the fan speed control system of the present invention.
Figure 4A:
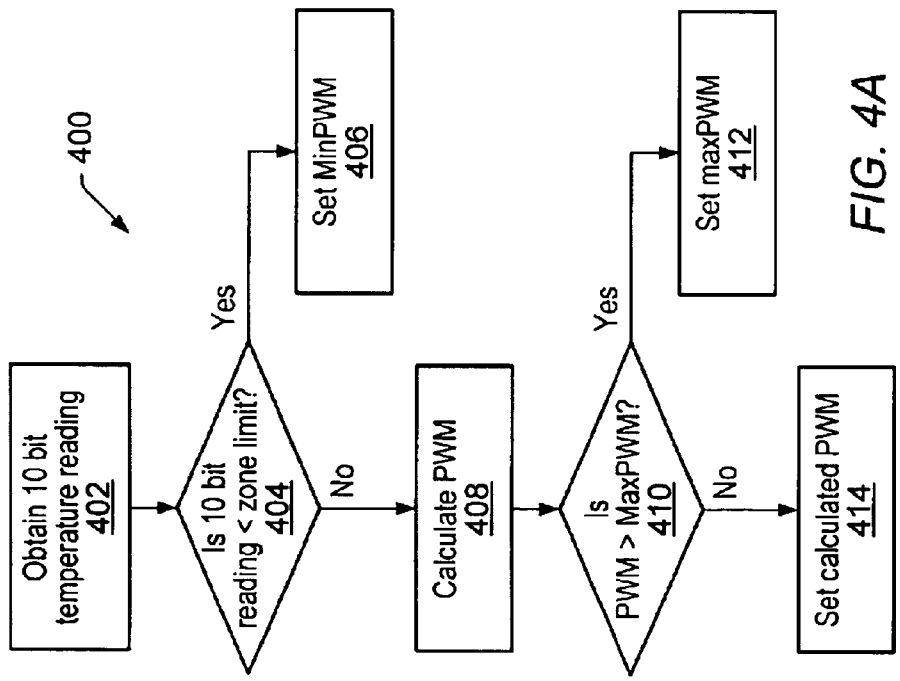
FIG. 4A is a flow diagram of one method for calculating PWM signals in the fan speed control system of the present invention.

FIG. 4A is a flow diagram 400 of one method for calculating PWM signals in the fan speed control system 100. In 402, a 10-bit temperature reading is obtained from a temperature sensor in the fan speed control system 100. As indicated at 404, an analysis is made concerning the 10-bit reading to determine if it is less than the zone limit 114. If the 10-bit reading is less than the zone limit 114, then the PWM signal generator 106 is set to generate the PWM minimum 116 signal as indicated at 406. Otherwise, a PWM signal is calculated 408 using the 10-bit reading. In 410, the calculated PWM signal is compared to the PWM maximum 120 and if it is greater than the PWM maximum 120, the PWM signal generator 106 is set to generate the PWM maximum 120 signal as indicated at 412. Otherwise, the PWM signal generator 106 is set to generate the calculated PWM signal 414.

FIG. 4B is a flow diagram 450 of another method for calculating PWM signals in the fan speed control system 100. Like flow diagram 400, in 402, a 10-bit temperature reading is obtained from a temperature sensor in the fan speed control system 100. As indicated at 404, an analysis is made concerning the 10-bit reading to determine if it is less than the zone limit 114. If the 10-bit reading is less than the zone limit 114, then the PWM signal generator 106 is set to generate the PWM minimum 116 signal as indicated at 406. In the alternative, unlike flow diagram 400, another comparison is made prior to calculating the PWM signal. In 452, the 10-bit reading is compared to the zone limit 114 plus the zone range 118. If the 10-bit reading is greater than the zone limit 114 plus the zone range 118, the PWM signal generator 106 is set to generate the PWM maximum 120 signal as indicated at 454. Otherwise, a PWM signal is calculated 456 using the 10-bit reading and the PWM signal generator 106 is set to generate the calculated PWM signal 458.

Upon viewing the present disclosure up to this point, those of ordinary skill in the art will understand that while the above description applies to positive temperature limits, modifications may be made to support negative zone limits. In order to support negative zone limits, the equation used for positive zone limits (0<Zone Limit<+127), highlighted in the previously shown box of equations, is preferably modified. The highlighted equation is again indicated here to facilitate comparison of the positive only implementation versus the positive and negative solutions:

$$\text{DeltaTemp}[1:0] = \text{Current Temp}[1:0]. \tag{1}$$

To extend equation (1) to include support for negative zone limit values (−127<Zone Limit<+127), conditional statements would need to be added for the cases where DeltaTemp[1:0] is not equal to CurrentTemp[1:0]. The conditional statement required to support negative zone limits is shown in the Code Sample below and is the suggested method of implementation. FIG. 6B illustrates Table 1, which shows all the possible combinations for the 2LSB's in the solution calculated for DeltaTemp[1:0].

```
Code Sample:
if ( ((current temp is negative) && (zone limit is negative)) && (current temp[0] == 1) )
{
    if (current temp[1] == 0) then DeltaTemp[1:0] = 2'b11;
    else DeltaTemp[1:0] =2'b01;
}
else DeltaTemp[1:0] = Current Temp[1:0];
```

FIG. 6A is a table that shows values that may be used in the above formulas that are used to calculate duty cycles according to an embodiment of the present invention. The values are exemplary for the embodiment described above. Various methods of calculating the mantissa and shift values are contemplated, but the use of such values is flexible for particular implementations of products constructed in accordance with the principles of the present invention. It is contemplated that other values could be calculated that would further reduce circuit complexity in the autofan architecture disclosed herein.

FIG. 6B is a table that shows values that may be used to calculate duty cycle according to an embodiment of the present invention when the temperature range to be monitored covers both positive and negative temperatures. POS represents positive numbers while NEG represents negative numbers. .xx implies that the 2 least significant bits of Current Temp don't matter in PWM calculations. When numbers rather than 'x's follow the decimal point, the numbers represent the two least significant bits of the value. These are binary numbers. The autofan algorithm only computes the DeltaTemp when the CurrentTemp is greater than or equal to the ZoneLimit. In all cases of the disclosed embodiments, except those in the shaded rows, the two least significant bits of the CurrentTemp the two least significant bits of DeltaTemp.

Thus, various embodiments of the systems and methods described above may facilitate design of a fan control system to accurately control the speed of a fan in an electrical system, while minimizing audio noise and maintaining smooth fan operation.

Although the embodiments above have been described in considerable detail, other versions are possible. Numerous variations and modifications will become apparent to those skilled in the art once the above disclosure is fully appreciated. It is intended that the following claims be interpreted to embrace all such variations and modifications. Note the section headings used herein are for organizational purposes only and are not meant to limit the description provided herein or the claims attached hereto.

We claim:

1. A method for performing pulse width modulated (PWM) signal duty cycle calculations in a fan speed control system operating to control rotational speed of at least one fan, the method comprising:
   obtaining a temperature reading from a first temperature sensor in the fan speed control system during a first time period, the temperature reading having resolution of a first number of bits;
   selecting a portion of the first number of bits for calculating a PWM signal duty cycle;
   calculating a PWM signal duty cycle with the resolution of the first number of bits in the temperature reading using only the portion of the first number of bits and zone parameters associated with the first temperature sensor;
   converting the PWM signal duty cycle into a PWM signal;
   providing the PWM signal having the calculated PWM signal duty cycle to the at least one fan.

2. The method of claim 1 wherein said selecting the portion of the first number of bits comprises selecting eight bits, wherein the eight bits offer one degree temperature resolution.

3. The method of claim 1 wherein said selecting the portion of the first number of bits comprises selecting eight bits, wherein the eight bits offer one half degree temperature resolution.

4. The method of claim 1 wherein said selecting the portion of the first number of bits comprises selecting eight bits, wherein the eight bits offer one fourth degree temperature resolution.

5. The method of claim 1 wherein said selecting the portion of the first number of bits comprises programmably selecting eight bits, wherein the eight bits are selected according to the zone parameters of the fan speed control system.

6. The method of claim 1 wherein the fan speed control system is an autofan block.

7. The method of claim 1 further comprising computing a desired PWM signal duty cycle according to the first number of bits and the zone parameters associated with the first temperature sensor.

8. The method of claim 7 further comprising comparing the desired PWM signal duty cycle to a predetermined minimum PWM duty cycle to determine if the PWM signal duty cycle should be calculated.

9. The method of claim 8 further comprising comparing the desired PWM signal duty cycle to a predetermined maximum PWM duty cycle to determine if the PWM signal should be calculated.

10. The method of claim 1 wherein said zone parameters include a zone limit, a zone range, a PWM minimum, a PWM maximum, a resolution parameter, and a current temperature.

11. A fan control system comprising:
at least one temperature sensor operable to obtain a temperature reading having a resolution of a first number of bits, each temperature sensor having related sensor parameters;
a PWM (pulse width modulated) signal generator operable to generate a PWM signal duty cycle according to a portion of the first number of bits;
wherein the PWM signal duty cycle is generated with a temperature resolution of the first number of bits using only the portion of the first number of bits.

12. The fan control system of claim 11 wherein the first number of bits comprise 10 bits and the sensor parameters are configured to allow 10 bit resolution of the temperature sensor readings with the portion of the first number of bits.

13. The fan control system of claim 11 wherein the portion of the first number of bits comprise 8 bits of temperature information, wherein the PWM signal generator is operable to calculate PWM signals at ¼ degree resolution from 8-bits of temperature information.

14. The fan control system of claim 11 wherein the PWM signal generator is operable to generate a PWM signal having a duty cycle corresponding to the PWM signal duty cycle calculated according to the portion of the first number of bits.

15. The fan control system of claim 14 wherein the duty cycle of the PWM signal changes with ½ degree changes in temperature.

16. The fan control system of claim 14 wherein the duty cycle of the PWM signal changes with ¼ degree changes in temperature.

17. A method for operating a fan control block to control rotational speed of at least one fan, the method comprising:
receiving a first temperature reading from a first temperature sensor during a first time period;
recording the first temperature reading as a 10 bit digital value;
calculating a pulse width modulated (PWM) signal duty cycle according to only a portion of the 10 bit digital value and according to sensor parameters associated with the first temperature sensor, wherein the PWM signal duty cycle is calculated with 10 bit resolution; and
providing a PWM signal having the calculated PWM signal duty cycle to the at least one fan.

18. The method of claim 17 further comprising selecting eight of the ten bits for the calculating of the PWM signal duty cycle at a 10-bit resolution level.

19. The method of claim 17 wherein a PWM signal is calculated from a first temperature reading that is recorded within one degree accuracy of the first temperature reading.

20. The method of claim 17 wherein a PWM signal is calculated from a first temperature reading that is recorded within one half degree accuracy of the first temperature reading.

21. The method of claim 17 wherein a PWM signal is calculated from a first temperature reading that is recorded within one fourth of a degree accuracy of the first temperature reading.

* * * * *